(12) United States Patent
Huang et al.

(10) Patent No.: US 12,496,623 B2
(45) Date of Patent: Dec. 16, 2025

(54) MACHINE FOR CLEANING SOLAR PANELS

(71) Applicant: INFLUENCE TECHNOLOGY CO., LTD., Tainan (TW)

(72) Inventors: Yen-Chih Huang, Tainan (TW); Chih-Kai Chuang, Tainan (TW)

(73) Assignee: Influence Technology Co., Ltd., Tainan (TW)

( * ) Notice: Subject to any disclaimer, the term of this patent is extended or adjusted under 35 U.S.C. 154(b) by 348 days.

(21) Appl. No.: 18/175,407

(22) Filed: Feb. 27, 2023

(65) Prior Publication Data

US 2023/0283230 A1 Sep. 7, 2023

(30) Foreign Application Priority Data

Mar. 1, 2022 (TW) .................................. 111107382

(51) Int. Cl.
*B08B 1/34* (2024.01)
*B08B 1/12* (2024.01)
*B08B 3/02* (2006.01)
*H02S 40/10* (2014.01)

(52) U.S. Cl.
CPC ................ *B08B 3/024* (2013.01); *B08B 1/12* (2024.01); *B08B 1/34* (2024.01); *H02S 40/10* (2014.12)

(58) Field of Classification Search
CPC .. B08B 1/34; B08B 3/024; B08B 1/12; H02S 40/10
See application file for complete search history.

(56) References Cited

U.S. PATENT DOCUMENTS

| 4,321,419 A | * | 3/1982 | Hanafin | ................ | H02S 40/10 |
| | | | | | 136/251 |
| 2020/0336101 A1 | * | 10/2020 | Stewart | ................ | H02S 40/10 |
| 2022/0166375 A1 | * | 5/2022 | Grossman | ............. | F24S 25/00 |
| 2022/0329201 A1 | * | 10/2022 | Lacaze | ................ | H02S 20/32 |

FOREIGN PATENT DOCUMENTS

| CN | 105598054 A | 5/2016 |
| CN | 105834130 A | 8/2016 |
| CN | 109225963 A | 1/2019 |

(Continued)

OTHER PUBLICATIONS

English abstract translation of CN105598054A.

(Continued)

*Primary Examiner* — Michael D Jennings
(74) *Attorney, Agent, or Firm* — WPAT, PC (57) ABSTRACT

A machine for cleaning solar panels includes a first X-axis device, a second X-axis device, and a Y-axis cleaning device. The first X-axis device includes a first track and a first moving device. The first moving device moves on the first track. The second X-axis device includes a second track and a second moving device. The second moving device moves on the second track. The Y-axis cleaning device includes a third track, a water tank, a slipway, a remover, and a sprayer. The third track moves along with the first moving device and the second moving device. The slipway slides on the third track. The remover and the sprayer are disposed on the slipway. The remover is configured to remove dirt from the solar panel, and the sprayer is connected to the water tank to spray water from the tank onto the solar panel.

11 Claims, 10 Drawing Sheets

(56) References Cited

FOREIGN PATENT DOCUMENTS

| | | |
|---|---|---|
| CN | 208939894 U | 6/2019 |
| CN | 110385294 A | 10/2019 |
| CN | 110681622 A | 1/2020 |
| CN | 214516194 U | 10/2021 |
| JP | 2001186998 A | 7/2001 |
| JP | 2002078648 A | 3/2002 |
| JP | 2016128150 A | 7/2016 |

OTHER PUBLICATIONS

English abstract translation of CN105834130A.
English abstract translation of CN109225963A.
English abstract translation of CN110385294A.
English abstract translation of CN110681622A.
English abstract translation of CN208939894U.
English abstract translation of CN214516194U.
Office action and search report of TW counterpart application No. 111107382 dated Sep. 7, 2023.
English abstract translation of the office action for TW counterpart application No. 111107382 dated Sep. 7, 2023.
English abstract translation of the search report for TW counterpart application No. 111107382 dated Sep. 7, 2023.
Japan Patent Office "First Office Action" issued on Apr. 24, 2024, JPO.

\* cited by examiner

MACHINE FOR CLEANING SOLAR PANELS

BACKGROUND

1. Field of the Disclosure

The present disclosure relates to a machine for cleaning solar panels.

2. Description of the Related Art

Currently, machines for cleaning solar panels are operated manually with no automatic capability. Also, it is known that such machines are heavy, and can damage solar panels, so improvement of the machines is called for.

SUMMARY

The present disclosure provides a machine for cleaning solar panels. In an example, the machine for cleaning solar panels includes a first X-axis device, a second X-axis device and a Y-axis cleaning device. The first X-axis device includes a first track and a first moving device. The first track is disposed at a bottom edge region of a solar panel. The first moving device moves on the first track. The second X-axis device includes a second track and a second moving device. The second track is disposed at a top edge region of the solar panel. The second moving device moves on the second track. The Y-axis cleaning device includes a third track, a water tank, a slipway, a remover and a sprayer. Two ends of the third track are disposed on the first moving device and the second moving device respectively, which moves the third track along with the first moving device and the second moving device. The water tank is disposed on the third track. The slipway is disposed on the third track, and slides on the third track. The remover and the sprayer are disposed on the slipway. The remover is configured to remove dirt from the solar panel. The sprayer is connected to the water tank to spray water from the water tank onto the solar panel.

The machine for cleaning solar panels of the present disclosure can automatically clean the solar panel, and the remover of the machine for cleaning solar panels will not crush or break the solar panel.

DETAILED DESCRIPTION

Figure 1:
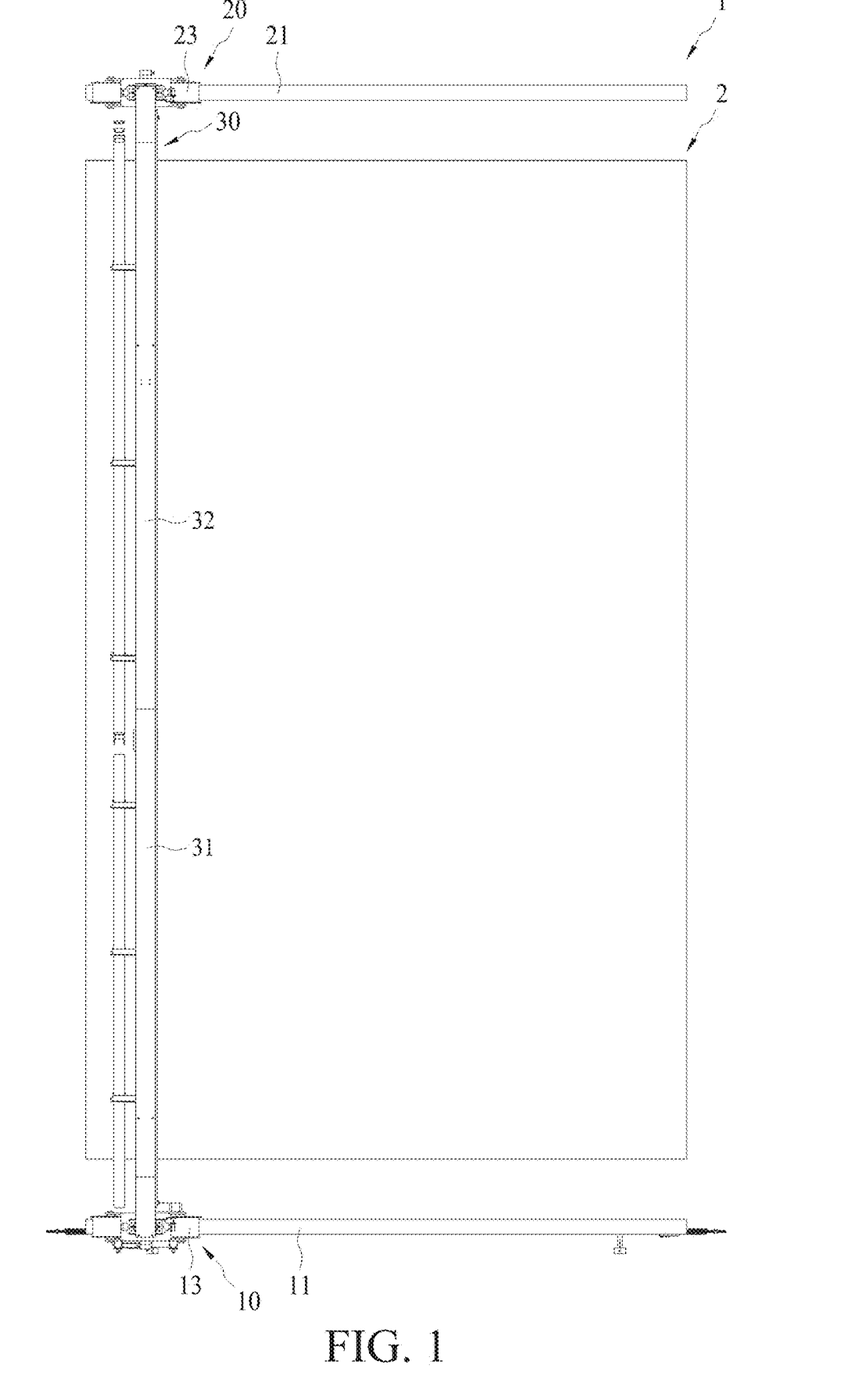
FIG. 1 is a schematic diagram of a machine for cleaning solar panels of the present disclosure.

FIG. 1 is a schematic diagram of a machine 1 for cleaning solar panels of the present disclosure. The machine 1 for cleaning solar panels includes a first X-axis device 10, a second X-axis device 20 and a Y-axis cleaning device 30. The machine 1 for cleaning solar panels of the present disclosure can be configured to clean at least one solar panel 2. The solar panel 2 can be disposed or provided on the ground or a roof, but is not limited thereto.

Figure 2:
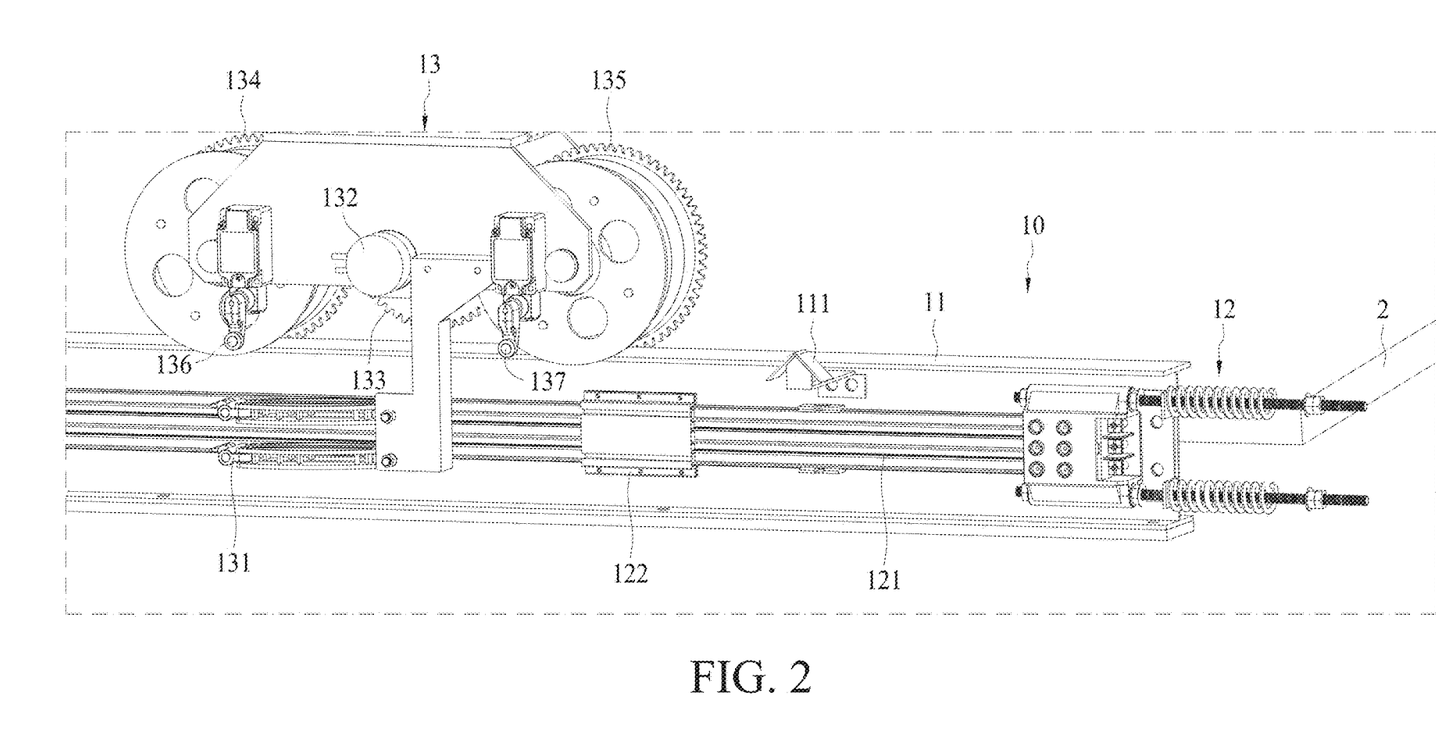
FIG. 2 is a schematic diagram of a first X-axis device of the machine for cleaning solar panels of the present disclosure.

FIG. 2 is a schematic diagram of a first X-axis device 10 of a machine for cleaning solar panels of the present disclosure. Referring to FIG. 1 and FIG. 2, in an example, the first X-axis device 10 includes a first track 11, a first power supply device 12 and a first moving device 13. The first track 11 is disposed or provided at a bottom edge region of the solar panel 2. For example, the first track 11 is disposed adjacent to a first side of the solar panel 2. In an example, the first track 11 may be H-shaped steel or an H-beam. The first power supply device 12 provides power to the first moving device 13, which moves the first moving device 13 on the first track 11.

In an example, the first power supply device 12 includes a first electric rail 121, disposed or provided on the first track 11. The first moving device 13 includes a first electric brush 131, electrically connected to the first electric rail 121, whereby the first power supply device 12 provides power to the first moving device 13.

In an example, the first moving device 13 further includes a first motor 132, a first drive gear 133, and two first linking gears 134 and 135. The first motor 132 is electrically connected to the first electric brush 131 and is configured to drive the first drive gear 133. The first drive gear 133 engages the two first linking gears 134 and 135. The first drive gear 133 is between and links the two first linking gears 134 and 135, thus, the two first linking gears 134 and 135 are linked with each other through the first drive gear 133. The first drive gear 133 and the two first linking gears 134 and 135 can rotate simultaneously. Thus, the first drive gear 133 drives the two first linking gears 134 and 135, moving the first moving device 13 on the first track 11.

In an example, the first power supply device 12 further includes two first insulated power-interrupting devices 122 (another first insulated power-interrupting device is not shown in the figure), disposed or provided at two ends of the first electric rail 121 respectively. When the first electric brush 131 moves onto one of the two first insulated power-interrupting devices 122, for example, when the first electric brush 131 moves onto the first insulated power-interrupting device 122, since the first electric brush 131 is not electrically connected to the first electric rail 121, the first power supply device 12 provides no power to the first moving device 13, which stops the first motor 132. That is, movement of the first moving device 13 is stopped, which prevents the first moving device 13 from further movement to one endpoint of the first track 11, preventing the first moving device 13 from derailing from the first track 11.

In an example, the first moving device 13 further includes two first limit switches 136 and 137, disposed or provided at outer edges of the two first linking gears 134 and 135. The first track 11 further includes two first stop plates 111 (another first stop plate is not shown in the figure), disposed or provided at two ends of the first track 11. When one of the two first limit switches 136 and 137 contacts one of two first stop plates 111, for example, when the first limit switch 137 contacts the first stop plate 111, the first moving device 13 has moved to one endpoint of the first track 11. The first moving device 13 derails from the first track 11 if the first moving device 13 moves further. Therefore, the signal can be transmitted to a control end to stop the first motor 132, that is, the movement of the first moving device 13 is stopped, preventing the first moving device 13 from derailing from the first track 11.

Figure 2A:
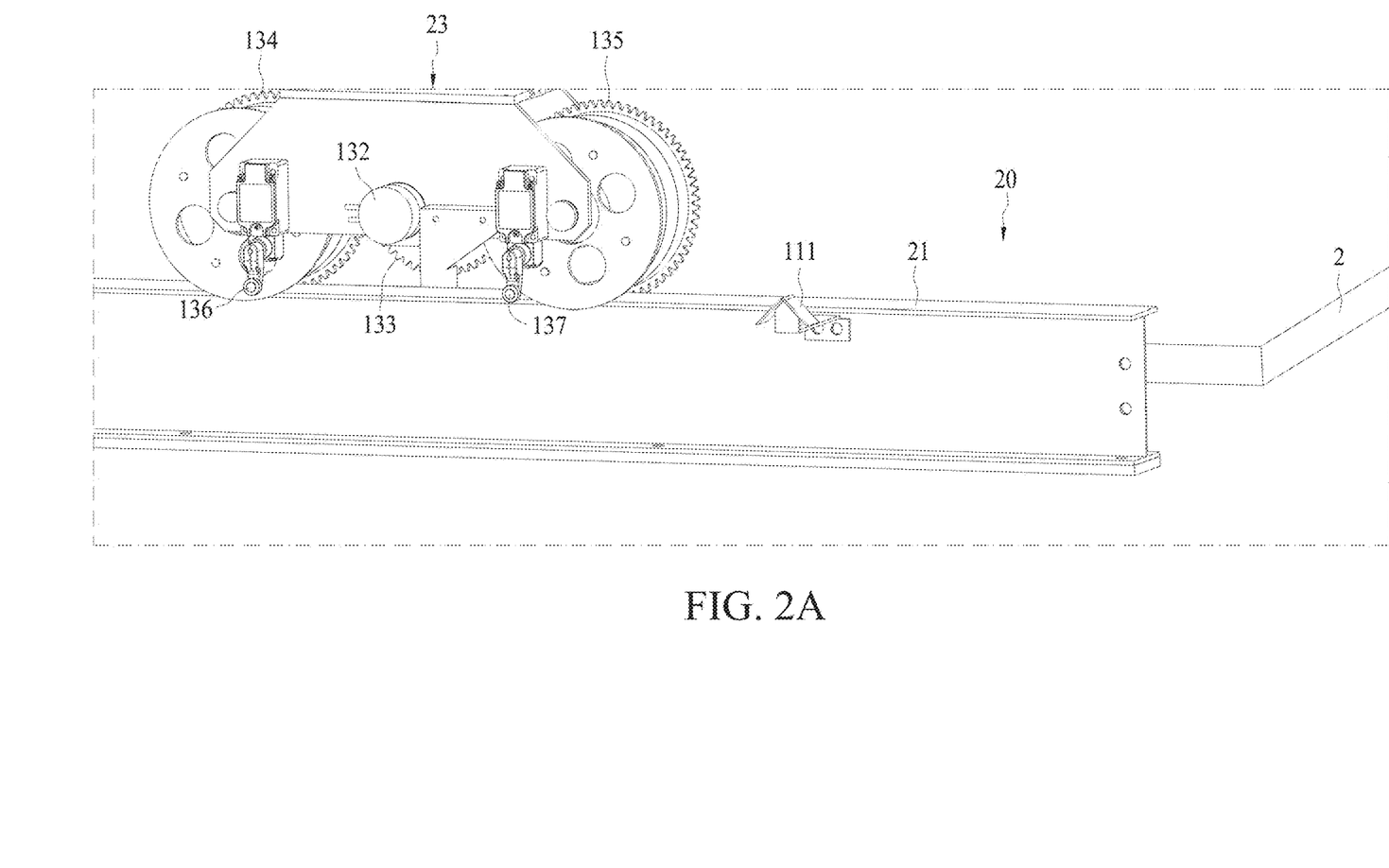
FIG. 2A is a schematic diagram of a second X-axis device of a machine for cleaning solar panels of the present disclosure.

FIG. 2A is a schematic diagram of a second X-axis device 20 of a machine for cleaning solar panels of the present disclosure. Referring to FIG. 1 and FIG. 2A, in an example, the second X-axis device 20 includes a second track 21 and a second moving device 23. The second track 21 is disposed or provided at a top edge region of the solar panel 2. For example, the second track 21 is disposed adjacent to a second side of the solar panel 2. The second side of the solar panel 2 is opposite to the first side of the solar panel 2. The second moving device 23 is electrically connected to the first power supply device 12, moving the second moving device 23 on the second track 21. In an example, the first power supply device 12 can be electrically connected to the second moving device 23 by using a linear rail (or electric rail) providing power thereto.

In an example, the second X-axis device 20 may further include a second power supply device, which can independently supply power to the second moving device 23, or also provide power to the first moving device 13. The second power supply device includes a second electric rail, disposed or provided on the second track 21. The second moving device 23 includes a second electric brush, electrically connected to the second electric rail. The second moving device 23 further includes a second motor 132, a second drive gear 133, and two second linking gears 134 and 135. The second motor 132, the second drive gear 133, and the two second linking gears 134 and 135 of the second moving device 23 may be the same as the second motor 132, the second drive gear 133, and the two second linking gears 134 and 135 of the first moving device 13, respectively. The second drive gear 133 engages the two second linking gears 134 and 135. The second drive gear 133 is between the two second linking gears 134 and 135, thus, the two second linking gears 134 and 135 are linked with each other through the second drive gear 133. The second drive gear 133 and the two second linking gears 134 and 135 can rotate simultaneously. Thus, the second motor 132 drives the second drive gear 133, and the second drive gear 133 drives the two second linking gears 134 and 135.

In an example, the second moving device 23 may further include two second limit switches, disposed or provided at outer edges of the two second linking gears 134 and 135 respectively. The second track 21 may further include two second stop plates, disposed or provided at two ends of the second track 21 respectively. When one of the two second limit switches contacts one of the two second stop plates, the second motor stops.

In an example, the second power supply device may further include two second insulated power-interrupting devices, disposed or provided at two ends of the second electric rail 21 respectively. When the second electric brush moves to one of the two second insulated power-interrupting devices, the second power supply device provides no power to the second moving device 23.

In an example, the second X-axis device 20 may have the same structure as the first X-axis device 10, and thus is not shown in a figure.

Figure 3:
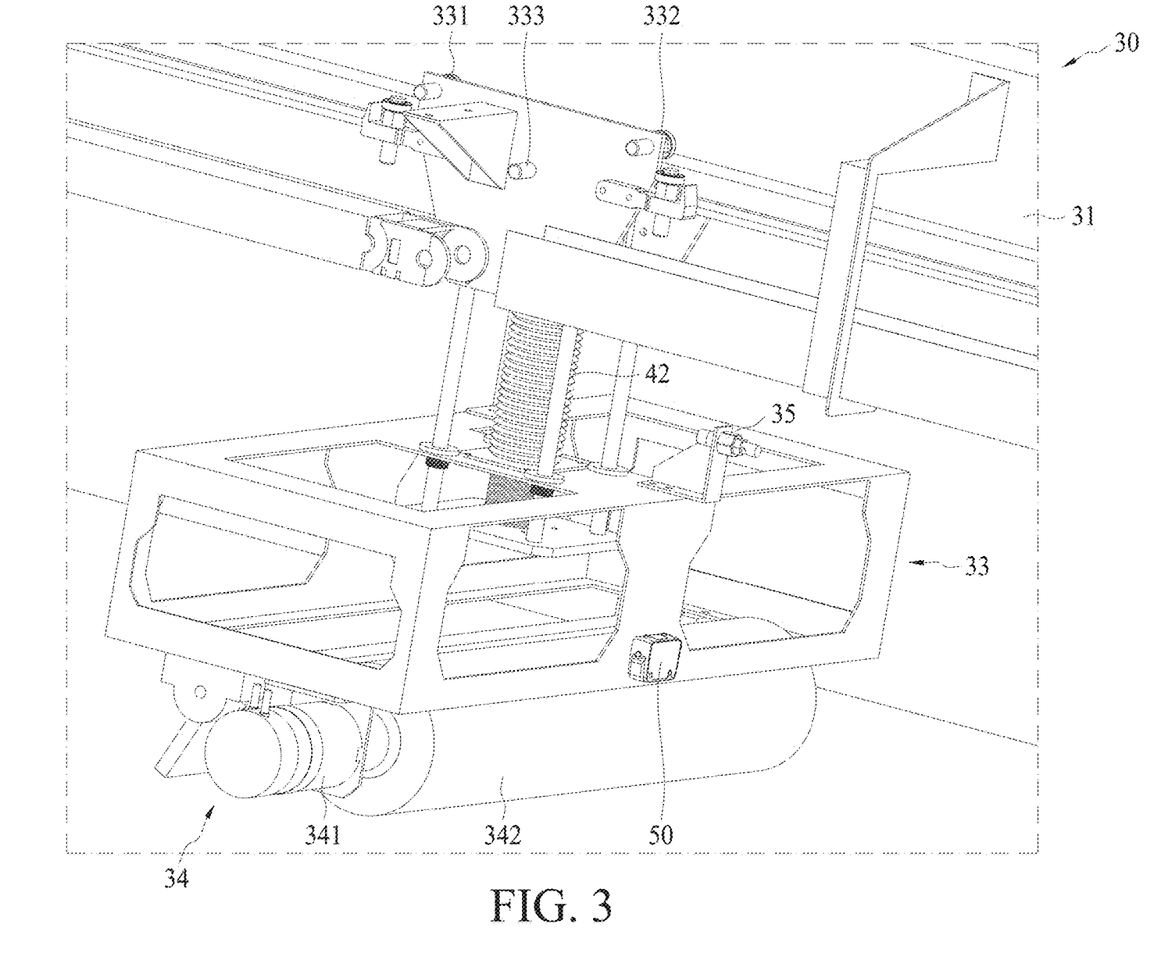
FIG. 3 is a partially enlarged perspective schematic diagram of a Y-axis cleaning device of the machine for cleaning solar panels of the present disclosure.
Figure 4:
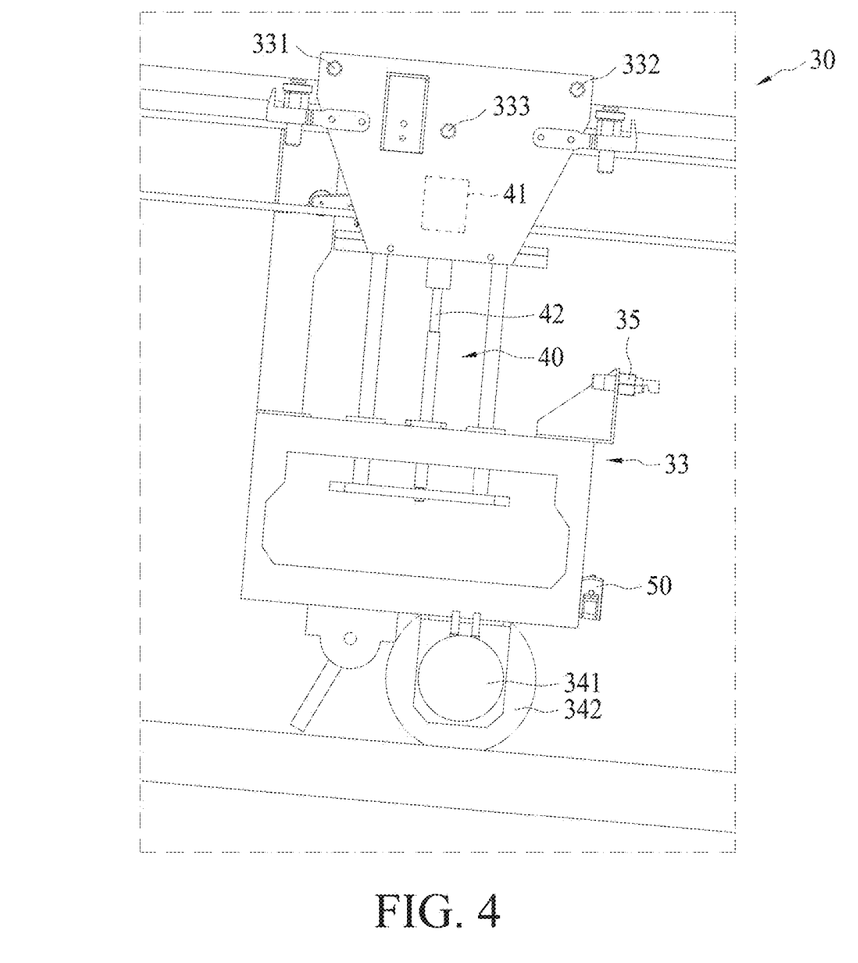
FIG. 4 is a partial side view of a Y-axis cleaning device of the machine for cleaning solar panels of the present disclosure.
Figure 5:
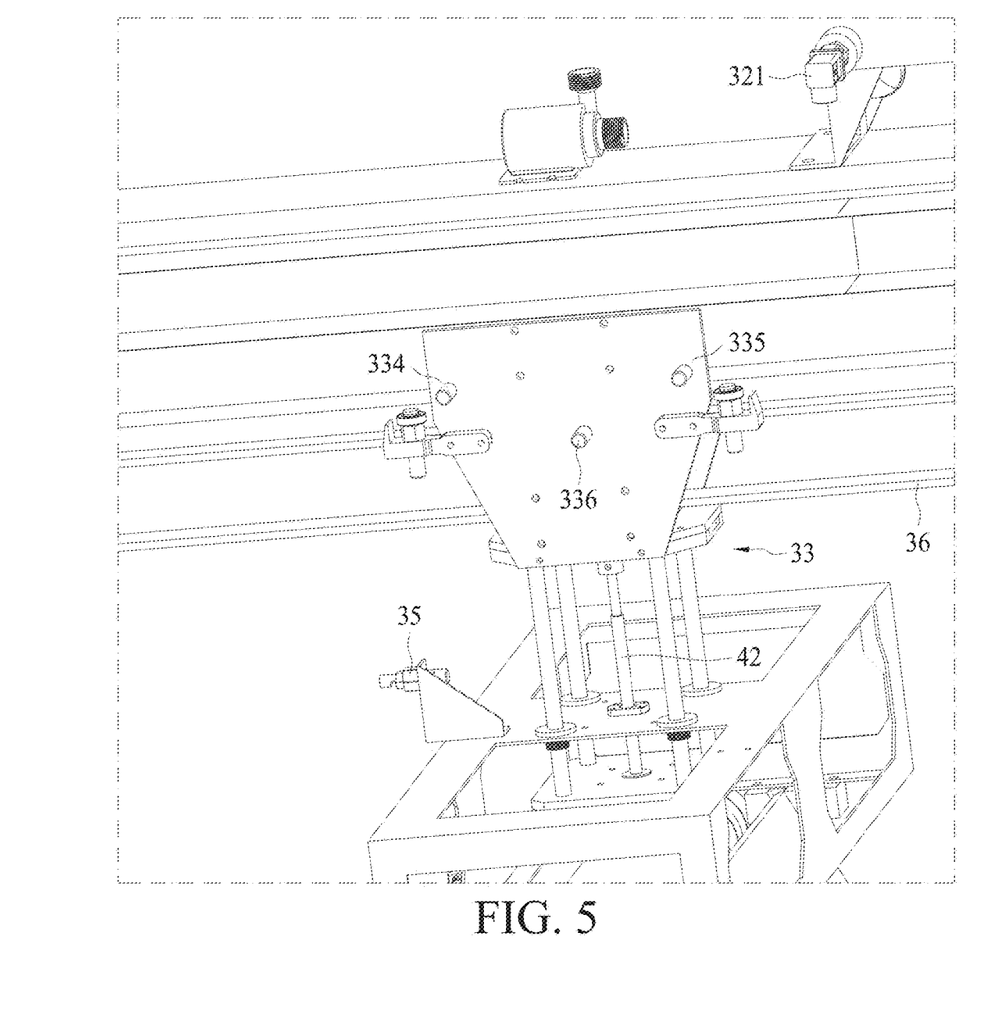
FIG. 5 is another partially enlarged perspective schematic diagram of a Y-axis cleaning device of the machine for cleaning solar panels of the present disclosure.
Figure 6:
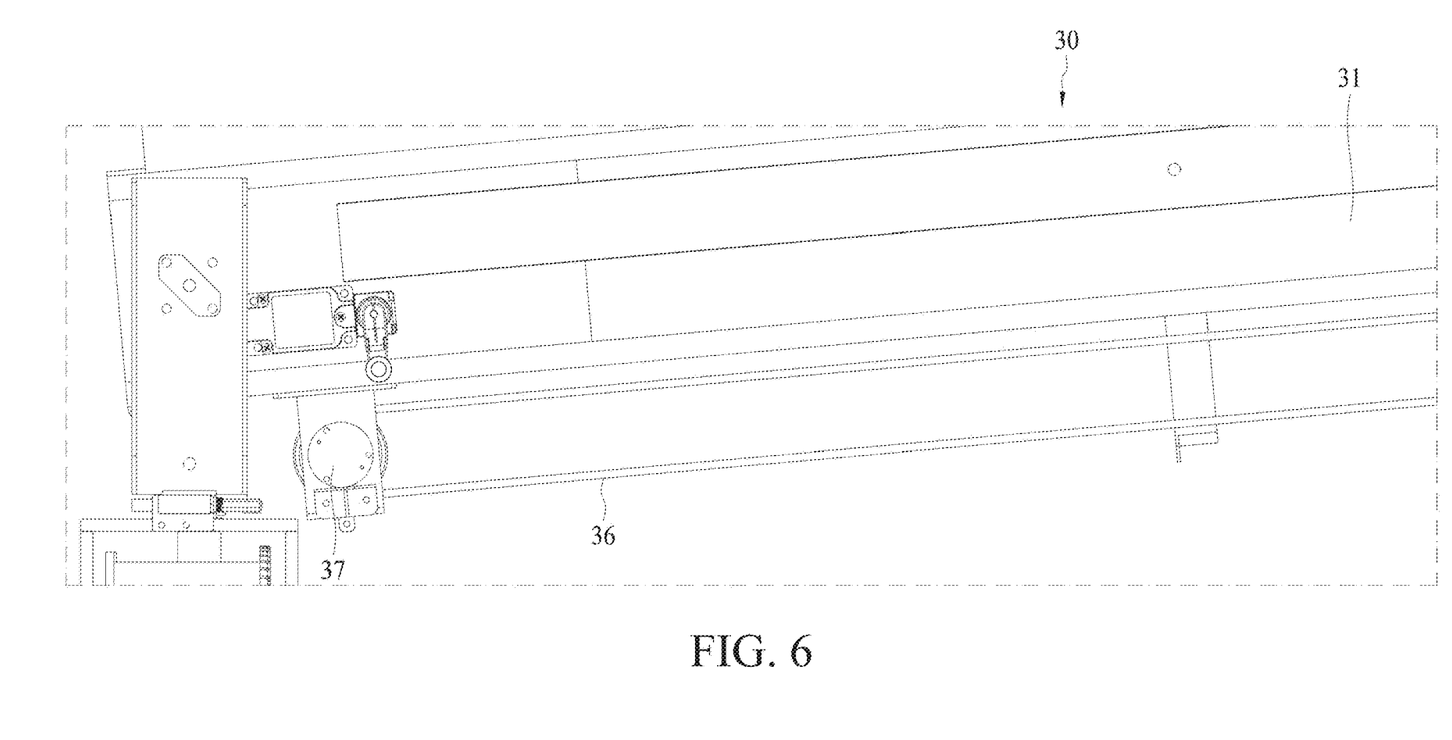
FIG. 6 is another partial side view of the Y-axis cleaning device of the machine for cleaning solar panels of the present disclosure.
Figure 7:
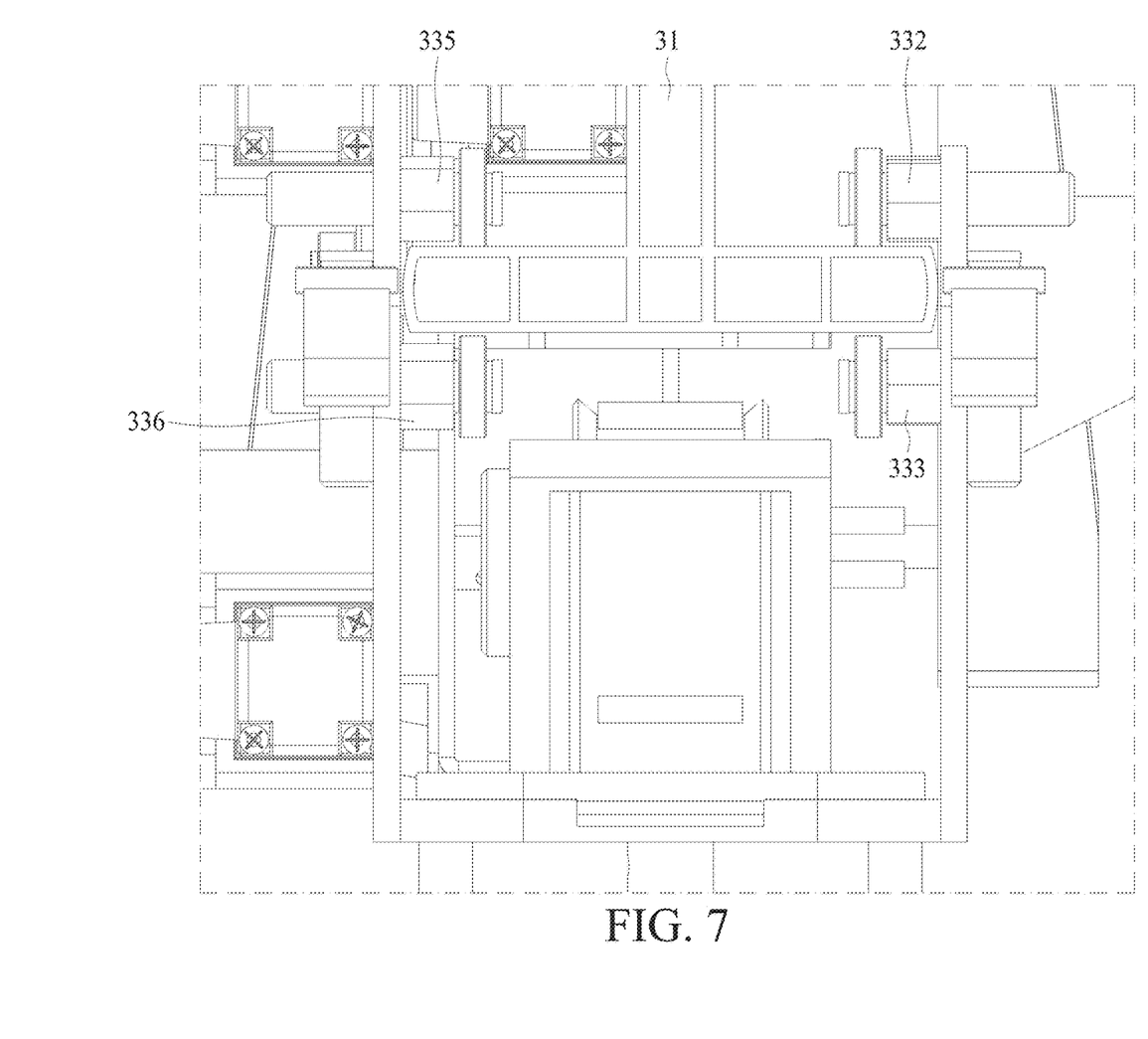
FIG. 7 is a schematic diagram of a combination of Y-axis wheels and a third track of the machine for cleaning solar panels of the present disclosure.
Figure 8:
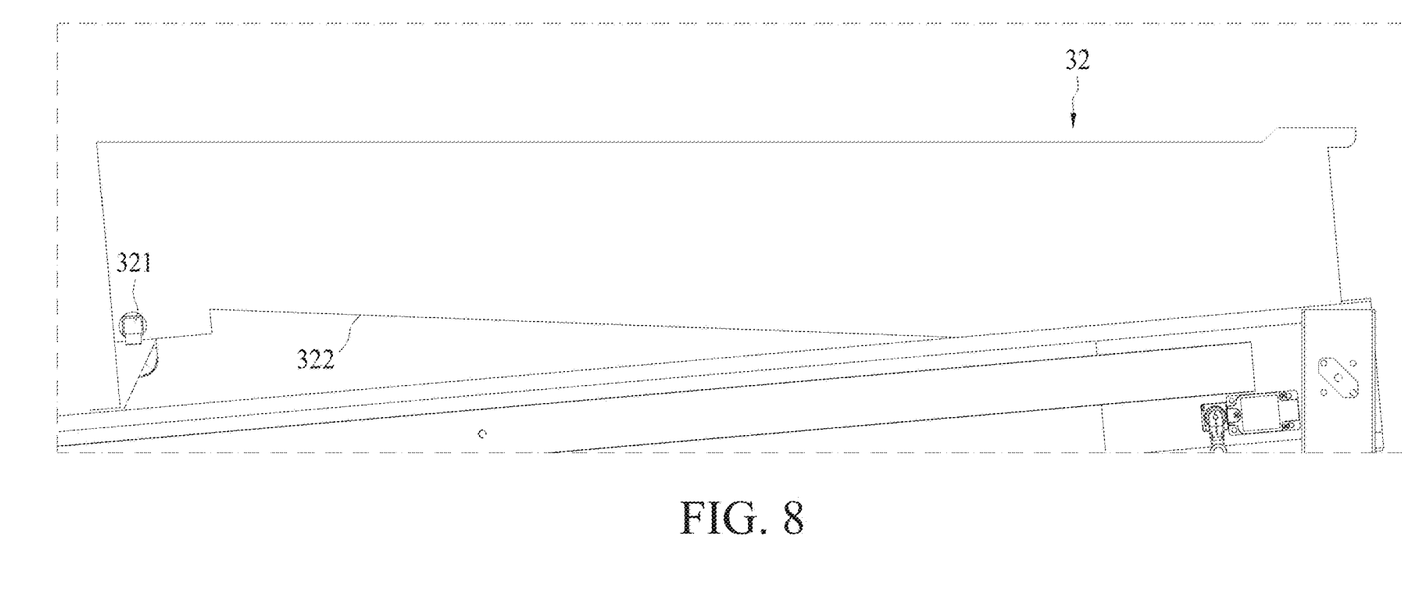
FIG. 8 is a schematic diagram of a water tank of a Y-axis cleaning device of the machine for cleaning solar panels of the present disclosure.

FIG. 3 is a partially enlarged perspective schematic diagram of a Y-axis cleaning device of the machine for cleaning solar panels of the present disclosure. FIG. 4 is a partial side view of a Y-axis cleaning device of the machine for cleaning solar panels of the present disclosure. FIG. 5 is another partially enlarged perspective schematic diagram of a Y-axis cleaning device of the machine for cleaning solar panels of the present disclosure. FIG. 6 is another partial side view of the Y-axis cleaning device of the machine for cleaning solar panels of the present disclosure. FIG. 7 is a schematic diagram of a combination of Y-axis wheels and a third track of the machine for cleaning solar panels of the present disclosure. FIG. 8 is a schematic diagram of a water tank of a Y-axis cleaning device of the machine for cleaning solar panels of the present disclosure. Referring to FIG. 1 and FIGS. 3 to 8, the Y-axis cleaning device 30 includes a third track 31, a water tank 32, a slipway 33, a remover 34 (or a washer) and a sprayer 35. Two ends of the third track 31 are disposed on the first moving device 13 and the second moving device 23 respectively, which moves the third track 31 with the first moving device 13 and the second moving device 23. For example, the third track 31, the first moving device 13, and the second moving device 23 can move simultaneously. In an example, the third track 31 may be H-shaped steel or an H-beam. The water tank 32 is disposed or provided on the third track 31.

In an example, the slipway 33 is disposed or provided on the third track 31, and the slipway 33 slides on the third track 31. In an example, the Y-axis cleaning device 30 further includes a timing belt 36 and a belt motor 37, disposed or provided under the third track 31. The slipway 33 is fixed on or secured to the timing belt 36. The belt motor 37 moves the timing belt 36 to drive the slipway 33. That is, the belt motor 37 drives the timing belt 36 to move, so as to drive the slipway 33 to move. In an example, the slipway 33 further includes a plurality of Y-axis wheels 331, 332, 333, 334, 335, 336, disposed or provided on the third track 31, which slides the slipway 33 on the third track 31.

In an example, the remover 34 and the sprayer 35 are disposed or provided on the slipway 33. The remover 34 is configured to remove dirt from the solar panel 2. In an example, the remover 34 includes a drive motor 341 and a roller brush 342. The drive motor 341 drives the roller brush 342 to roll to remove dirt from the solar panel 2. In an example, the roller brush 342 may be nylon wool.

In an example, the sprayer 35 is connected to the water tank 32, to spray water therefrom onto the solar panel 2. In an example, the sprayer 35 can be connected to the water tank 32 by a water pipe (not shown in the figure). In an example, the water tank 32 further includes a water level switch 321 and a bottom surface 322. The bottom surface 322 is flush with or level with the water level switch 321. When the internal water level of the water tank 32 is lower than the water level switch 321, water delivery to the sprayer 35 is stopped, with the remaining water is a residual water region. A position of the water level switch 321 will affect the size of the residual water region in the water tank 32, thus it is necessary for the water level switch 321 to be located at a relatively low position. Therefore, the bottom surface 322 of the water tank 32 is designed to be flush with or level with the water level switch 321, to minimize waste of water.

In an example, the machine 1 for cleaning solar panels of the present disclosure further includes a Z-axis moving device 40. The Z-axis moving device 40 is disposed or provided on the slipway 33, and includes a Z-axis motor 41 and a ball screw 42. The Z-axis motor 41 moves the ball screw 42 along a Z-axis direction, controlling the Z-axis height of the slipway 33. For example, the Z-axis motor 41 drives the ball screw 42 to move in the Z-axis direction so as to control a Z-axis height of the slipway 33. In an example, the machine 1 for cleaning solar panels of the present disclosure further includes an infrared device 50 to measure the distance between the roller brush 342 and the solar panel 2, so as to control the Z-axis height of the slipway 33, which protects the solar panel 2 from being crushed or broken by the roller brush 342 moving overly proximate thereto.

In an example, the machine 1 for cleaning solar panels of the present disclosure further includes at least one camera (not shown in the figure), disposed or provided on the slipway 33 to capture an image of the surface of the solar panel 2 for analysis and/or image recognition. A cleaning mode of the machine 1 for cleaning solar panels 1 of the present disclosure can be adjusted and the power generation quality of the solar panel 2 can be maintained through image data collection and analysis.

Figure 9:
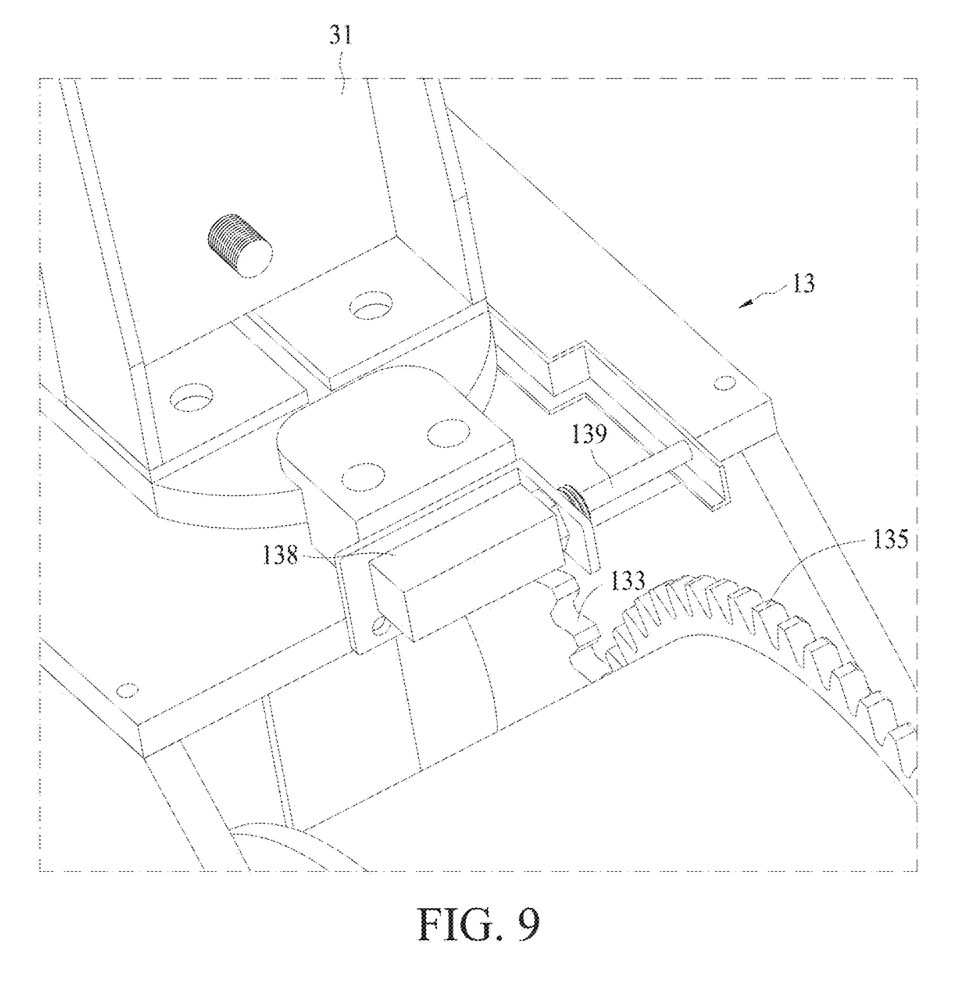
FIG. 9 is a schematic diagram of a first linear sensor of the machine for cleaning solar panels of the present disclosure.

FIG. 9 is a schematic diagram of a first linear sensor of the machine for cleaning solar panels of the present disclosure. Referring to FIG. 1, FIG. 2, and FIG. 9, in an example, the first moving device 13 further includes a first linear sensor 138, disposed or provided on the first moving device 13 in a manner of being linked with or connected with one end of the third track 31. The second moving device 23 further includes a second linear sensor (not shown in the figure), disposed or provided on the second moving device 23 in a manner of being linked with or connected with the other end of the third track 31. The first linear sensor 138 and the second linear sensor are configured to detect whether the third track 31 is skewed (or inclined). For example, when the third track 31 is skewed or inclined due to inconsistent speed of the first moving device 13 and the second moving device 23, a front end portion 139 of the first linear sensor 138 will be squeezed. Then, the first linear sensor 138 will send a signal to the control end, which accelerates the motor of the first moving device 13 or the second moving device 23 until two sides of the third track 31 become horizontal again. Then, the first moving device 13 and the second moving device 23 move forward simultaneously.

The machine 1 for cleaning solar panels of the present disclosure can automatically clean the solar panel 2, move and perform cleaning on the X axis and Y axis of the solar panel 2, and control the Z axis height of the slipway 33, preventing the remover 34 of the machine 1 from damaging the solar panel 2.

The foregoing examples are only to illustrate the principles of the present disclosure and efficacy thereof, not to limit the disclosure. Modifications and changes made by those skilled in the art do not violate the spirit of the present disclosure. The scope of rights in shall be as listed in the scope of the patent application described as follows.

What is claimed is:

1. A machine for cleaning at least one solar panels, comprising:
    a first X-axis device, including a first track and a first moving device, the first track being disposed adjacent to a first side of the at least one solar panel, and the first moving device moving on the first track;
    a second X-axis device, including a second track and a second moving device, the second track being disposed adjacent to a second side of the at least one solar panel, and the second moving device moving on the second track, wherein the second side of the at least one solar panel is opposite to the first side of the at least one solar panel; and
    a Y-axis cleaning device, including a third track, a water tank, a slipway, a remover and a sprayer, two ends of the third track being disposed on the first moving device and the second moving device respectively, the third track moving along with the first moving device and the second moving device, the water tank being disposed on the third track, the slipway being disposed on the third track, and sliding on the third track, the remover and the sprayer being disposed on the slipway, the remover being configured to remove dirt from the at least one solar panel, and the sprayer being connected to the water tank to spray water in the water tank onto the at least one solar panel,
    wherein the first X-axis device further includes a first power supply device, the first power supply device includes a first electric rail disposed on the first track, and the first moving device includes a first electric brush, the first electric brush is electrically connected to the first electric rail.

2. The machine for cleaning at least one solar panels of claim 1, wherein the remover comprises a drive motor and a roller brush, the drive motor drives the roller brush to roll so as to remove the dirt from the at least one solar panel.

3. The machine for cleaning at least one solar panels of claim 1, further comprising a Z-axis moving device disposed on the slipway, wherein the Z-axis moving device comprises a Z-axis motor and a ball screw, the Z-axis motor drives the ball screw to move in the Z-axis direction so as to control a Z-axis height of the slipway.

4. The machine for cleaning at least one solar panels of claim 1, wherein the Y-axis cleaning device further includes a timing belt and a belt motor disposed under the third track, the slipway is fixed on the timing belt, and the belt motor drives the timing belt to move, so as to drive the slipway to move.

5. The machine for cleaning at least one solar panels of claim 4, wherein the slipway further includes a plurality of Y-axis wheels disposed on the third track to make the slipway slide on the third track.

6. The machine for cleaning at least one solar panels of claim 1, further comprising at least one camera disposed on the slipway to capture an image of a surface of the at least one solar panel.

7. The machine for cleaning at least one solar panels of claim 1, wherein the water tank further includes a water level switch and a bottom surface, the bottom surface is flush with the water level switch.

8. The machine for cleaning at least one solar panels of claim 1, wherein the first moving device further includes a first motor, a first drive gear and two first linking gears, the first motor drives the first drive gear, and the first drive gear drives the two first linking gears; the second moving device further includes a second motor, a second drive gear and two second linking gears, the second motor drives the second drive gear, and the second drive gear drives the two second linking gears.

9. The machine for cleaning at least one solar panels of claim 8, wherein the first moving device further includes two first limit switches disposed at outer edges of the two first linking gears respectively; the first track further includes two first stop plates disposed at two ends of the first track respectively, and when one of the two first limit switches contacts one of the two first stop plates, the first motor stops.

10. The machine for cleaning at least one solar panels of claim 8, wherein the first power supply device further includes two first insulated power-interrupting devices disposed at two ends of the first electric rail respectively, and when the first electric brush moves to one of the two first insulated power-interrupting devices, the first power supply device provides no power to the first moving device.

11. The machine for cleaning at least one solar panels of claim 1, wherein the first moving device further includes a first linear sensor disposed on the first moving device in a manner of being linked with one end of the third track; the second moving device further includes a second linear sensor disposed on the second moving device in a manner of being linked with the other end of the third track, the first linear sensor and the second linear sensor are configured to detect whether the third track is skewed.

\* \* \* \* \*